(12) United States Patent
Yamada et al.

(10) Patent No.: US 8,796,123 B2
(45) Date of Patent: Aug. 5, 2014

(54) METHOD OF MANUFACTURING SILICON CARBIDE SEMICONDUCTOR DEVICE

(75) Inventors: Shunsuke Yamada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/489,152

(22) Filed: Jun. 5, 2012

(65) Prior Publication Data

US 2012/0315746 A1    Dec. 13, 2012

Related U.S. Application Data

(60) Provisional application No. 61/494,180, filed on Jun. 7, 2011.

(30) Foreign Application Priority Data

Jun. 7, 2011 (JP) .................................. 2011-126886

(51) Int. Cl.
*H01L 21/425* (2006.01)

(52) U.S. Cl.
USPC ........... 438/527; 438/306; 438/373; 438/231; 438/519; 438/551; 438/931; 438/212; 438/268; 438/303

(58) Field of Classification Search
CPC ...................... H01L 21/26513; H01L 29/0873; H01L 29/66719
USPC ......... 438/306, 373, 231, 519, 527, 551, 931, 438/212, 268, 303, 514, 526
See application file for complete search history.

(56) References Cited

U.S. PATENT DOCUMENTS

| | | | |
|---|---|---|---|
| 6,015,725 A | 1/2000 | Hirayama | |
| 6,238,980 B1 | 5/2001 | Ueno | |
| 2004/0031981 A1* | 2/2004 | Grivna | 257/302 |
| 2011/0031505 A1* | 2/2011 | Harada et al. | 257/77 |
| 2011/0068344 A1* | 3/2011 | Loechelt | 257/66 |

FOREIGN PATENT DOCUMENTS

| | | |
|---|---|---|
| JP | 2-194630 A | 8/1990 |
| JP | 6-163910 A | 6/1994 |
| JP | 10-065160 A | 3/1998 |
| JP | 2000/022137 A | 1/2000 |
| JP | 2004/146465 A | 5/2004 |
| JP | 2004/349329 A | 12/2004 |
| JP | 2005/536056 A | 11/2005 |
| WO | WO-2004/017419 A1 | 2/2004 |

* cited by examiner

*Primary Examiner* — Kyoung Lee
*Assistant Examiner* — Ratisha Mehta
(74) *Attorney, Agent, or Firm* — Venable LLP; Michael A. Sartori; Tamatane J. Aga (57) ABSTRACT

An impurity of a first conductivity type is implanted onto a silicon carbide substrate through an opening in a mask layer. First and second films made of first and second materials respectively are formed. It is sensed that etching of the first material is performed during anisotropic etching, and then anisotropic etching is stopped. An impurity of a second conductivity type is implanted onto the silicon carbide substrate through the opening narrowed by the first and second films. Thus, the impurity regions can be formed in an accurately self-aligned manner.

8 Claims, 11 Drawing Sheets

METHOD OF MANUFACTURING SILICON CARBIDE SEMICONDUCTOR DEVICE

BACKGROUND OF THE INVENTION

1. Field of the Invention

The present invention relates to a method of manufacturing a silicon carbide semiconductor device.

2. Description of the Background Art

In manufacturing a semiconductor device, the step of selectively forming an impurity region in a semiconductor substrate is performed. For example, in manufacturing an n-channel type MOSFET (Metal Oxide Semiconductor Field Effect Transistor), in order to obtain an npn structure, the step of partially forming a p-type impurity region in an n-type semiconductor substrate and further partially forming an n-type impurity region in this p-type impurity region is often performed. Namely, impurity regions different in extension from each other are formed. Both of the impurity regions should be formed in a self-aligned manner, in order to suppress variation in characteristics of the MOSFET, in particular, variation in channel length. In a case where a silicon substrate is employed as a semiconductor substrate, a double diffusion technique with which extension of an impurity region is adjusted by adjusting a degree of progress of impurity diffusion through heat treatment has widely been used.

In a case where a silicon carbide substrate is employed as a semiconductor substrate, however, a diffusion coefficient of an impurity is small and a region into which ions have been implanted becomes an impurity region substantially as it is through heat treatment. Therefore, it is difficult to employ the double diffusion technique. Thus, in order to obtain impurity regions formed in a self-aligned manner, a size of an opening in a mask for ion implantation should be adjusted. For example, according to Japanese Patent Laying-Open No. 2000-22137 (Patent Literature 1), a polycrystalline silicon film or an oxide film formed by oxidizing the same is employed as a mask and different impurity regions are formed by making use of movement of a mask end owing to oxidation or oxide film removal.

According to the technique described in the literature above, a sidewall of an opening is subjected to thermal oxidation in order to narrow the opening in a mask and the oxide film is removed in order to widen the opening narrowed as such. A thermal oxidation step for adjusting the opening in the mask, however, may often be undesirable or difficult. Specifically, a high temperature approximately from 900 to 1200° C. required in the thermal oxidation step may give rise to a problem. For example, in a case where a metal underlying layer is formed on a silicon carbide substrate, alloying may occur between a metal underlying film and the silicon carbide substrate at a high temperature. In addition, a rate of oxidation in the thermal oxidation step is not much high, and for example, a rate of steam oxidation is around 15 nm/minute. Therefore, efficiency in semiconductor device production may be low.

Then, the following method is available as a method of narrowing an opening in a mask. Initially, a film is formed on a silicon carbide substrate provided with a mask having an opening. As the film is formed on a sidewall of the opening, the opening is narrowed. Then, anisotropic etching allows a portion of the film on the sidewall to remain in the opening in the mask, while the remaining portion is removed. The opening narrowed by the film can thus be obtained. With this method, however, anisotropic etching should be stopped at appropriate timing. If etching is stopped too early, a portion of the film to be removed remains and the remaining portion may interfere ion implantation. If etching is stopped too late, the film does not sufficiently remain on the sidewall and the opening may not sufficiently be narrowed. Therefore, simply by performing this method, it is difficult to accurately form an impurity region.

SUMMARY OF THE INVENTION

The present invention was made in view of the problems above, and an object of the present invention is to provide a method of manufacturing a silicon carbide semiconductor device capable of forming impurity regions in an accurately self-aligned manner.

A method of manufacturing a silicon carbide semiconductor device according to the present invention has the following steps. A mask layer is formed on a silicon carbide substrate. The mask layer includes a cover portion covering the silicon carbide substrate and an opening having a sidewall. An impurity of a first conductivity type is implanted onto the silicon carbide substrate through the opening in the mask layer. A first film made of a first material is formed on the silicon carbide substrate on which the mask layer has been formed. The first film includes a first portion arranged on the cover portion, a second portion arranged on the sidewall of the opening, and a third portion arranged on the silicon carbide substrate in the opening. A second film made of a second material different from the first material is formed on the silicon carbide substrate on which the mask layer and the first film have been formed. The second film includes a portion arranged on each of the first to third portions of the first film. Anisotropic etching for removing a portion of the second film arranged on the third portion of the first film is started. It is sensed that etching of the first material is performed during anisotropic etching. Anisotropic etching is stopped after it is sensed that etching of the first material is performed in the step of sensing that etching of the first material is performed. An impurity of a second conductivity type is implanted onto the silicon carbide substrate through the opening narrowed by the second portion of the first film and the second film arranged on the second portion after the step of stopping anisotropic etching.

According to the present invention, an end point of anisotropic etching of the second film is detected by sensing that etching of the first film is performed. Since etching of the first film is performed not only in the opening in the mask layer but also on the cover portion of the mask layer, it can accurately be sensed that etching of the first film is performed. Therefore, since anisotropic etching of the second film can accurately be stopped, the second film can accurately remain on the sidewall of the opening. Thus, since the impurity of the second conductivity type is implanted through the accurately narrowed opening, a region of the second conductivity type can accurately be formed in a part of the region into which the impurity of the first conductivity type has been implanted through the opening.

In the manufacturing method above, the mask layer may be made of the second material.

Since the material for the mask layer is thus the same as the material for the second film, the method of manufacturing a silicon carbide semiconductor device can further be simplified.

In the manufacturing method above, after a first film is formed and before a second film is formed, the following steps may be performed. A third film made of a material different from the first material is formed. A fourth film made of the first material is formed on the third film.

In this case, as etching proceeds, etching of the first material involved with etching of the fourth film is sensed, and thereafter, at a time interval, etching of the first material involved with etching of the first film will be sensed. Namely, prior to sensing of etching of the first film, sensing predicting the same is carried out. Therefore, accuracy in stopping etching can further be enhanced.

In the manufacturing method above, an underlying layer may be formed on the silicon carbide substrate before a mask layer is formed.

Thus, overetching of the silicon carbide substrate can be suppressed.

In the manufacturing method above, the underlying layer may be made of the first material.

Thus, since the material for the underlying layer is the same as the material for the first film, the method of manufacturing a silicon carbide semiconductor device can further be simplified.

In the manufacturing method above, the underlying layer may be made of a material different from the first material.

Thus, a selective etching ratio between the underlying layer and the first film can be ensured, and hence accuracy in an amount of remaining underlying layer after anisotropic etching can be enhanced. Therefore, variation in implantation of an impurity of the second conductivity type through the underlying layer can be suppressed.

In the manufacturing method above, the first material does not have to contain a metal element.

Thus, metal contamination of an apparatus for manufacturing a silicon carbide semiconductor device can be avoided.

In the manufacturing method above, the first material may be made of any of a silicon-based material and a carbon-based material.

Thus, the material for the first film can be free from a metal element.

As is clear from the description above, according to the present invention, impurity regions can be formed in an accurately self-aligned manner.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

First Embodiment

Figure 1:
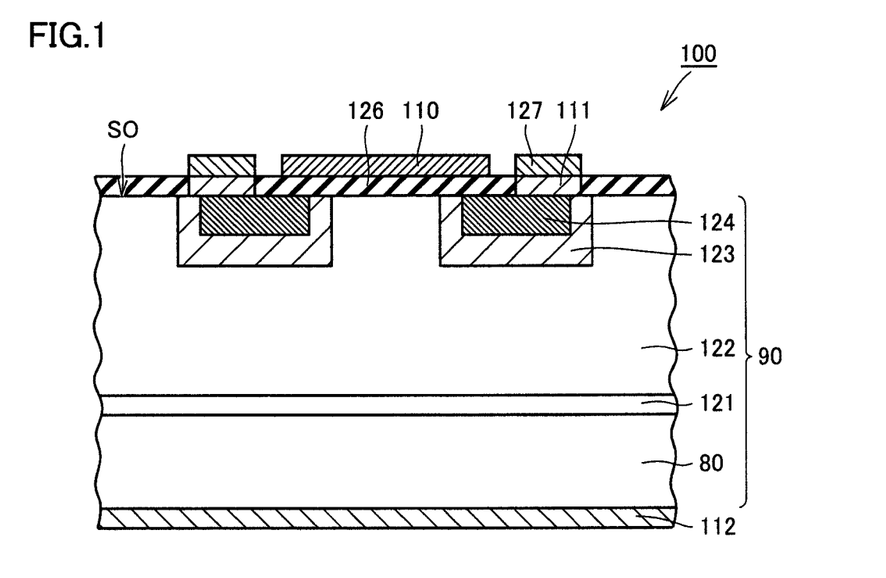
FIG. 1 is a partial cross-sectional view schematically showing a construction of a silicon carbide semiconductor device in a first embodiment of the present invention.

Initially, a structure of a MOSFET 100 representing a silicon carbide semiconductor device in the present embodiment will be described with reference to FIG. 1. MOSFET 100 is specifically a vertical DiMOSFET (Double Implanted MOSFET). MOSFET 100 has an epitaxial substrate 90, an oxide film 126, a source electrode 111, an upper source electrode 127, a gate electrode 110, and a drain electrode 112. Epitaxial substrate 90 has a single crystal substrate 80, a buffer layer 121, a breakdown voltage holding layer 122, a p region 123, and an $n^+$ region 124. A two-dimensional shape (a shape when viewed from above in FIG. 1) of MOSFET 100 is, for example, a rectangle or a square having a side of a length not shorter than 2 mm.

Single crystal substrate 80 and buffer layer 121 each have an n conductivity type. Single crystal substrate 80 is preferably composed of silicon carbide. Concentration of an n-type conductive impurity in buffer layer 121 is, for example, $5 \times 10^{17}$ cm$^{-3}$. In addition, buffer layer 121 has a thickness, for example, of 0.5 μm.

Breakdown voltage holding layer 122 is formed on buffer layer 121, and it is composed of silicon carbide having an n conductivity type. For example, breakdown voltage holding layer 122 has a thickness of 10 μm and concentration of an n-type conductive impurity is $5 \times 10^{15}$ cm$^{-3}$.

In a surface S0 of epitaxial substrate 90, a plurality of p regions 123 having a p conductivity type are formed at a distance from one another. In addition, in surface S0, n$^+$ region 124 is formed to be located inside each p region 123. In surface S0, p region 123 has a channel region lying between n$^+$ region 124 and breakdown voltage holding layer 122 and covered with gate electrode 110 with oxide film 126 being interposed.

On breakdown voltage holding layer 122 exposed between the plurality of p regions 123 at surface S0, oxide film 126 is formed. Specifically, oxide film 126 is formed to extend from n$^+$ region 124 in one p region 123 over p region 123, breakdown voltage holding layer 122 exposed between two p regions 123, and the other p region 123 to n$^+$ region 124 in the other p region 123. Gate electrode 110 is formed on oxide film 126. Therefore, a portion of oxide film 126 having gate electrode 110 formed thereon has a function as a gate insulating film. In addition, source electrode 111 is formed on n$^+$ region 124. A part of source electrode 111 may be in contact with p region 123. Upper source electrode 127 is formed on source electrode 111.

A method of manufacturing MOSFET 100 will now be described below.

Figure 2:
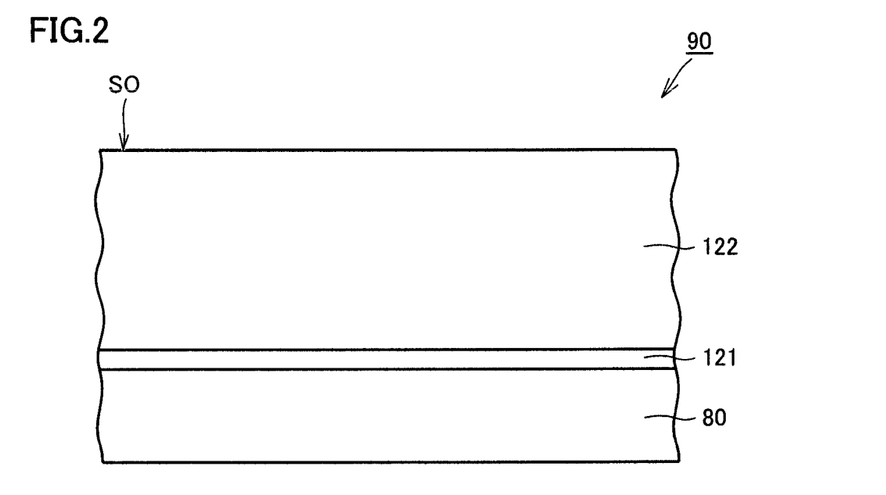
FIG. 2 is a partial cross-sectional view schematically showing a first step in a method of manufacturing a silicon carbide semiconductor device in FIG. 1.

As shown in FIG. 2, epitaxial substrate 90 (silicon carbide substrate) having surface S0 is prepared. Specifically, buffer layer 121 is formed on a main surface of single crystal substrate 80, and breakdown voltage holding layer 122 is formed on buffer layer 121. Buffer layer 121 is composed of silicon carbide having an n conductivity type, and it has a thickness, for example, of 0.5 μm. In addition, concentration of the conductive impurity in buffer layer 121 is set, for example, to $5 \times 10^{17}$ cm$^{-3}$. Breakdown voltage holding layer 122 has a thickness, for example, of 10 μm. Further, concentration of the n conductive impurity in breakdown voltage holding layer 122 is set, for example, to $5 \times 10^{15}$ cm$^{-3}$.

Figure 3:
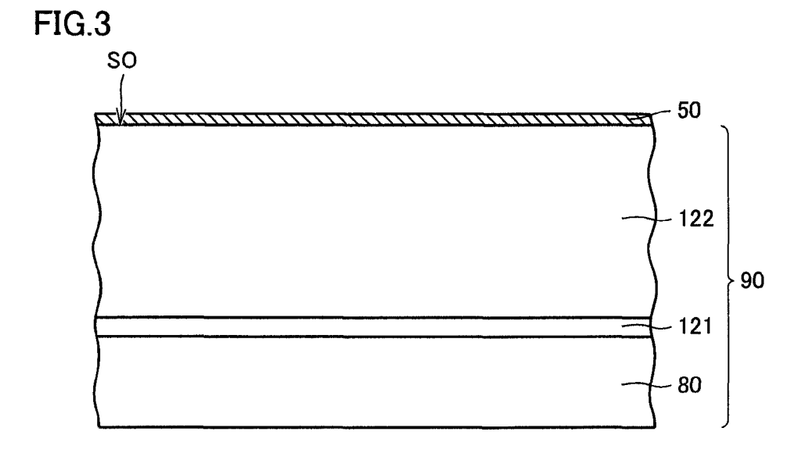
FIG. 3 is a partial cross-sectional view schematically showing a second step in the method of manufacturing a silicon carbide semiconductor device in FIG. 1.

As shown in FIG. 3, in the present embodiment, an etching stop layer 50 (an underlying layer) is formed on surface S0 of epitaxial substrate 90. A material for etching stop layer 50 is, for example, silicon nitride (SiN), titanium (Ti), or silicon (Si). Etching stop layer 50 has a thickness, for example, not smaller than 50 nm and not greater than 300 nm.

Figure 4:
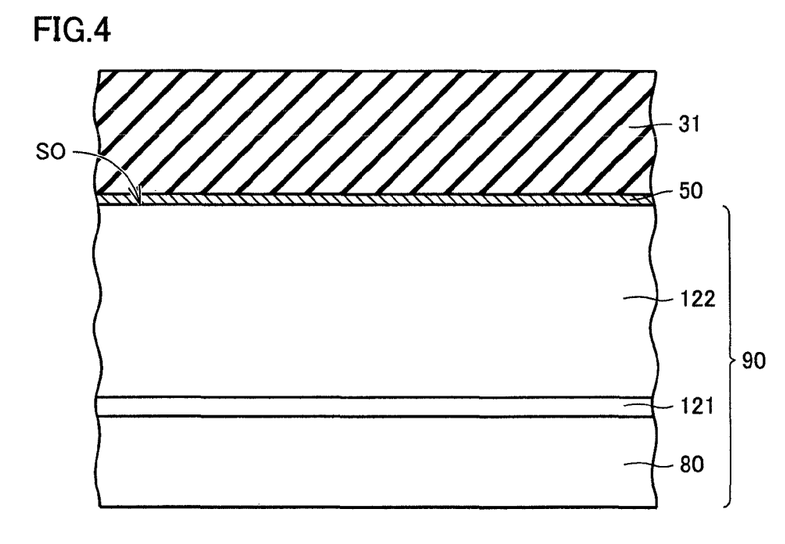
FIG. 4 is a partial cross-sectional view schematically showing a third step in the method of manufacturing a silicon carbide semiconductor device in FIG. 1.

As shown in FIG. 4, a mask layer 31 is deposited on epitaxial substrate 90 with etching stop layer 50 being interposed. Preferably, a material for mask layer 31 is any of silicon oxide (SiO$_2$) and polysilicon, and silicon oxide is more preferred.

Figure 5:
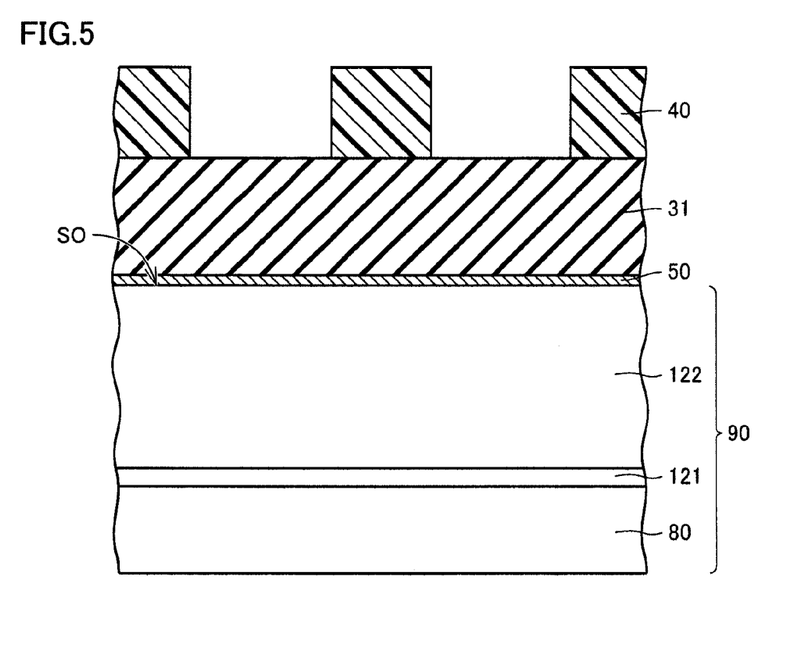
FIG. 5 is a partial cross-sectional view schematically showing a fourth step in the method of manufacturing a silicon carbide semiconductor device in FIG. 1.

As shown in FIG. 5, a photoresist pattern 40 is formed on mask layer 31 with photolithography.

Figure 6:
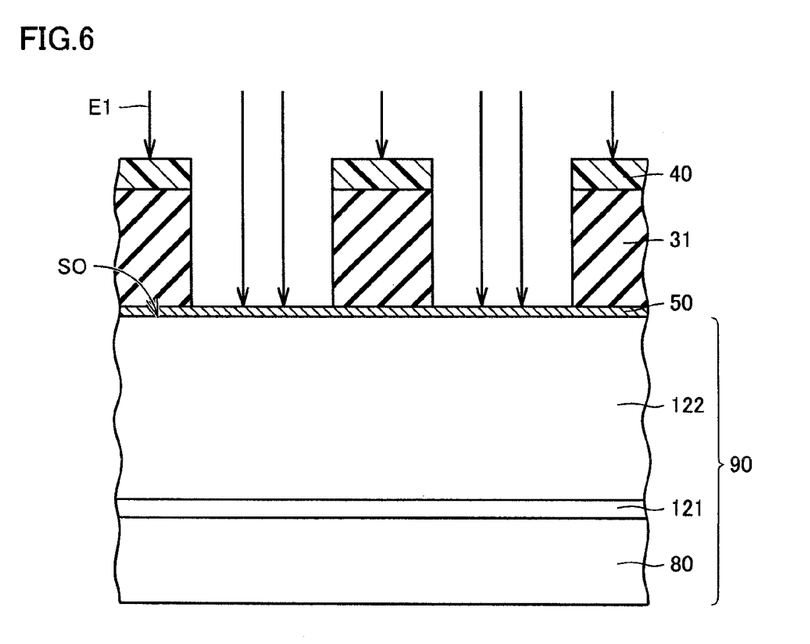
FIG. 6 is a partial cross-sectional view schematically showing a fifth step in the method of manufacturing a silicon carbide semiconductor device in FIG. 1.

As shown in FIG. 6, mask layer 31 is patterned through anisotropic etching E1 using photoresist pattern 40 as a mask. Anisotropic etching E1 is specifically dry etching, and for example, it is reactive ion etching or ion milling. Then, remaining photoresist pattern 40 is removed.

Figure 7:
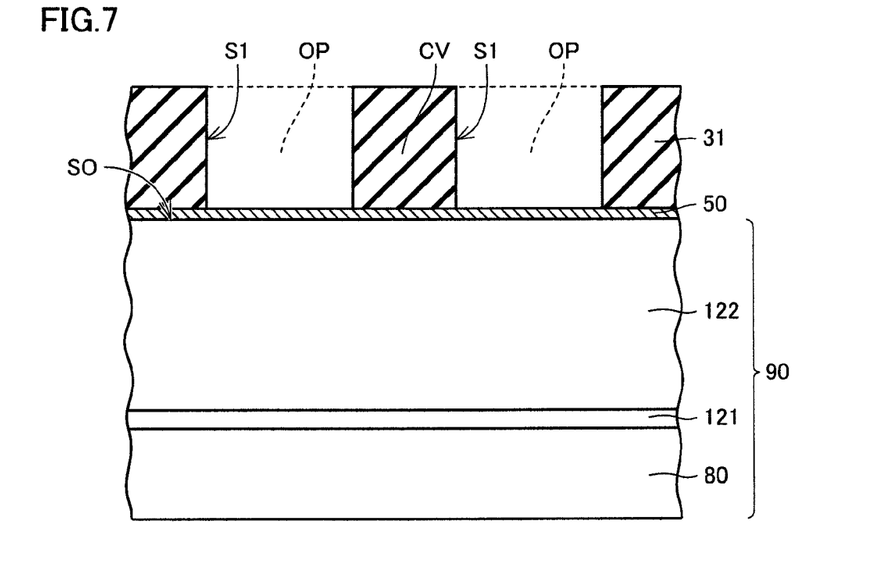
FIG. 7 is a partial cross-sectional view schematically showing a sixth step in the method of manufacturing a silicon carbide semiconductor device in FIG. 1.

As shown in FIG. 7, as a result of the steps so far, mask layer 31 having an opening is formed on epitaxial substrate 90 with etching stop layer 50 being interposed. Specifically, mask layer 31 has a cover portion CV covering epitaxial substrate 90 with etching stop layer 50 being interposed and an opening OP having a sidewall S1. In terms of dimension specifications of MOSFET 100 (FIG. 1), in a plan view, an area of opening OP is normally smaller than an area of cover portion CV. Specifically, a ratio of the area of opening OP to the total area of cover portion CV and opening OP (that is, an area of mask layer 31) is preferably not higher than 5% and more preferably not higher than 3%, in terms of dimension specifications of MOSFET 100 (FIG. 1).

Figure 8:
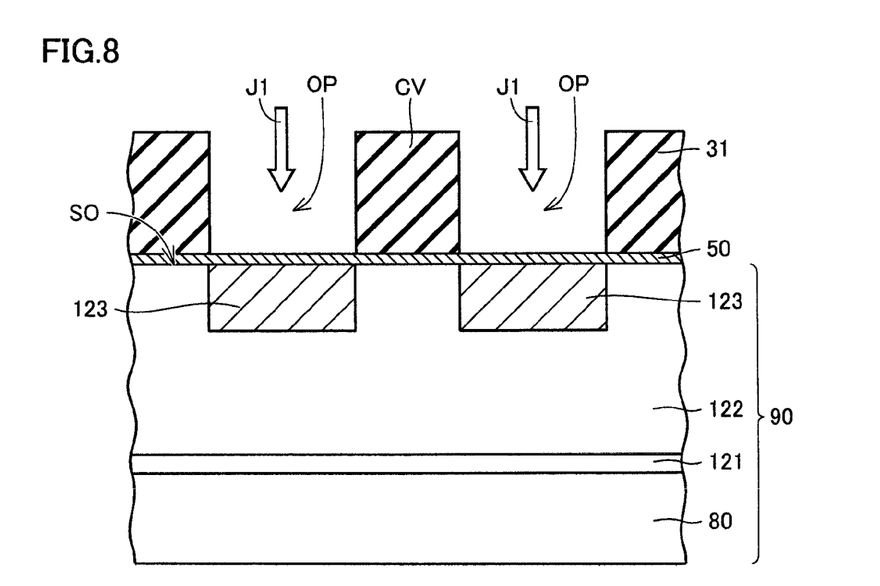
FIG. 8 is a partial cross-sectional view schematically showing a seventh step in the method of manufacturing a silicon carbide semiconductor device in FIG. 1.

As shown in FIG. 8, as a result of ion implantation J1 through opening OP in mask layer 31, a p-type (the first conductivity type) impurity is implanted onto epitaxial substrate 90. Thus, p region 123 is formed from surface S0 to a prescribed depth in epitaxial substrate 90.

Figure 9:
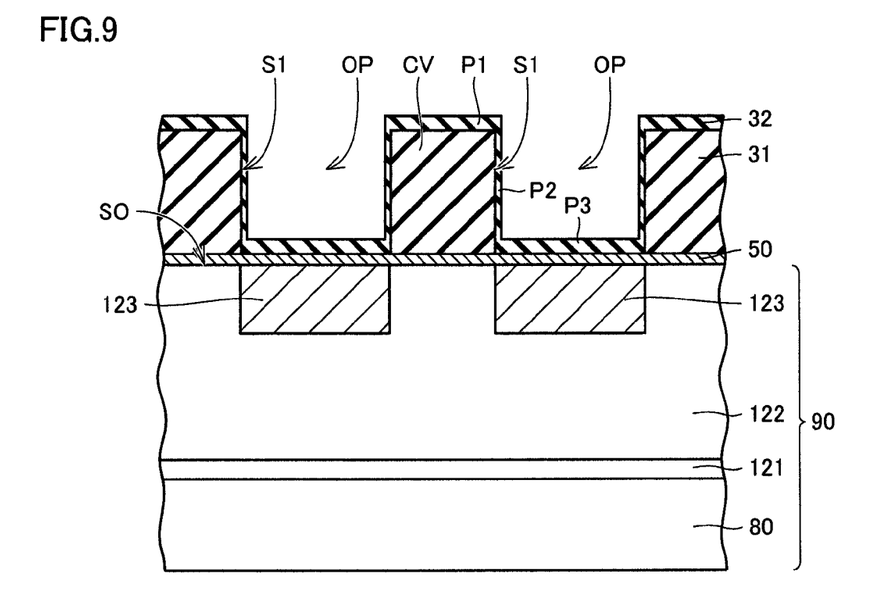
FIG. 9 is a partial cross-sectional view schematically showing an eighth step in the method of manufacturing a silicon carbide semiconductor device in FIG. 1.

As shown in FIG. 9, thereafter, an end point film 32 (a first film) is formed on epitaxial substrate 90 on which etching stop layer 50 and mask layer 31 have been formed. End point film 32 has portions P1 to P3. Portion P1 (a first portion) is arranged on cover portion CV, portion P2 (a second portion) is arranged on sidewall S1 of opening OP, and portion P3 (a third portion) is arranged on epitaxial substrate 90 in opening OP, with etching stop layer 50 being interposed. A material (a first material) for end point film 32 preferably does not substantially contain a metal element, and it is, for example, a silicon-based material or a carbon-based material. The silicon-based material is, for example, silicon nitride (SiN). The carbon-based material is, for example, carbon (C). In addition, a material for end point film 32 may be the same as a material for etching stop layer 50. In contrast, a material for end point film 32 may be different from a material for etching stop layer 50.

Figure 10:
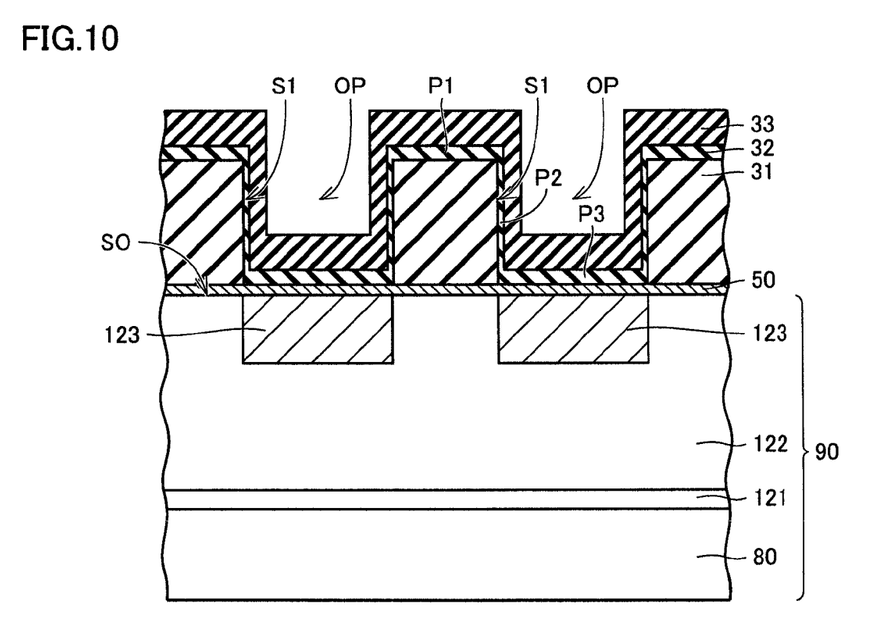
FIG. 10 is a partial cross-sectional view schematically showing a ninth step in the method of manufacturing a silicon carbide semiconductor device in FIG. 1.

As shown in FIG. 10, a spacer film 33 (a second film) is formed on epitaxial substrate 90 on which mask layer 31 and end point film 32 have been formed. Spacer film 33 includes a portion arranged on each of portions P1 to P3 of end point film 32. Spacer film 33 is formed, for example, with p-CVD (plasma-Chemical Vapor Deposition). In p-CVD, for example, a film formation temperature is around 400° C. and a rate of film formation is from 50 to 300 nm/minute.

Spacer film 33 is made of a material (a second material) different from the material (the first material) for end point film 32. Preferably, a material for each of end point film 32 and spacer film 33 is selected such that atoms of at least one type are contained in only one of spacer film 33 and end point film 32. A material for spacer film 33 is, for example, silicon oxide (SiO$_2$). Preferably, a material for spacer film 33 is the same as a material for mask layer 31.

Then, anisotropic etching for removing a portion of spacer film 33 that is arranged on portions P1 and P3 of end point film 32 is started. Anisotropic etching is dry etching, and for example, it is reactive ion etching or ion milling.

In addition, detection of an end point for identifying a type of a material being etched is started. An end point is detected, for example, based on spectroscopic analysis of light emitted during etching or mass spectrometry of atoms emitted by etching.

Figure 11:
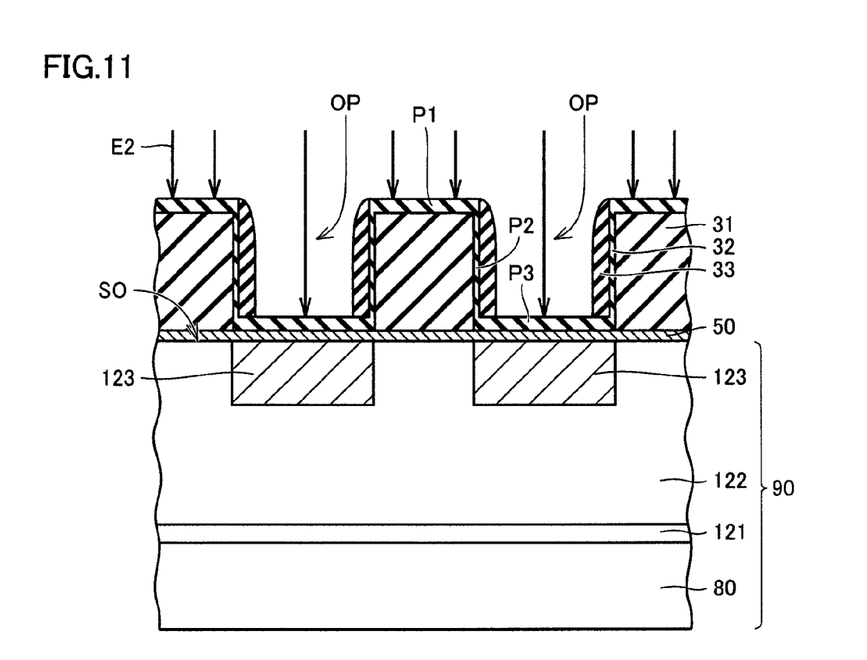
FIG. 11 is a partial cross-sectional view schematically showing a tenth step in the method of manufacturing a silicon carbide semiconductor device in FIG. 1.

As shown in FIG. 11, as anisotropic etching E2 proceeds, portions P1 and P3 of end point film 32 are exposed. Accordingly, the material for end point film 32 starts to be etched. Namely, etching of the material different from the material for spacer film 33 is started. Therefore, exposure of a part of end point film 32 is sensed in end point detection. In the present embodiment, etching by a prescribed amount is further performed after exposure of end point film 32 was sensed. In other words, overetching is performed, so that portions P1 and P3 are removed. Thereafter, anisotropic etching E2 is stopped. It is noted that this overetching may not be performed.

Figure 12:
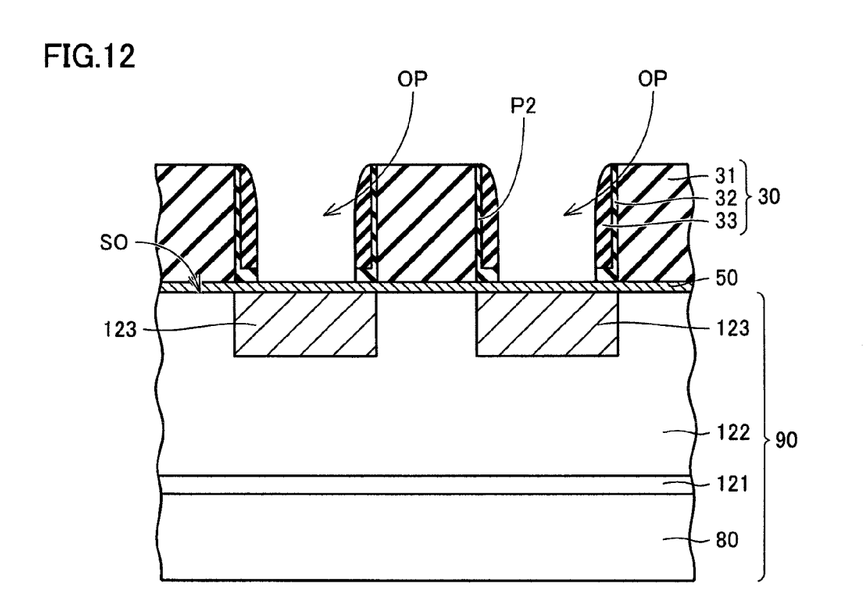
FIG. 12 is a partial cross-sectional view schematically showing an eleventh step in the method of manufacturing a silicon carbide semiconductor device in FIG. 1.

As shown in FIG. 12, as a result of etching described above, a composite mask 30 having mask layer 31, end point film 32, and spacer film 33 is formed on epitaxial substrate 90 with etching stop layer 50 being interposed.

Figure 13:
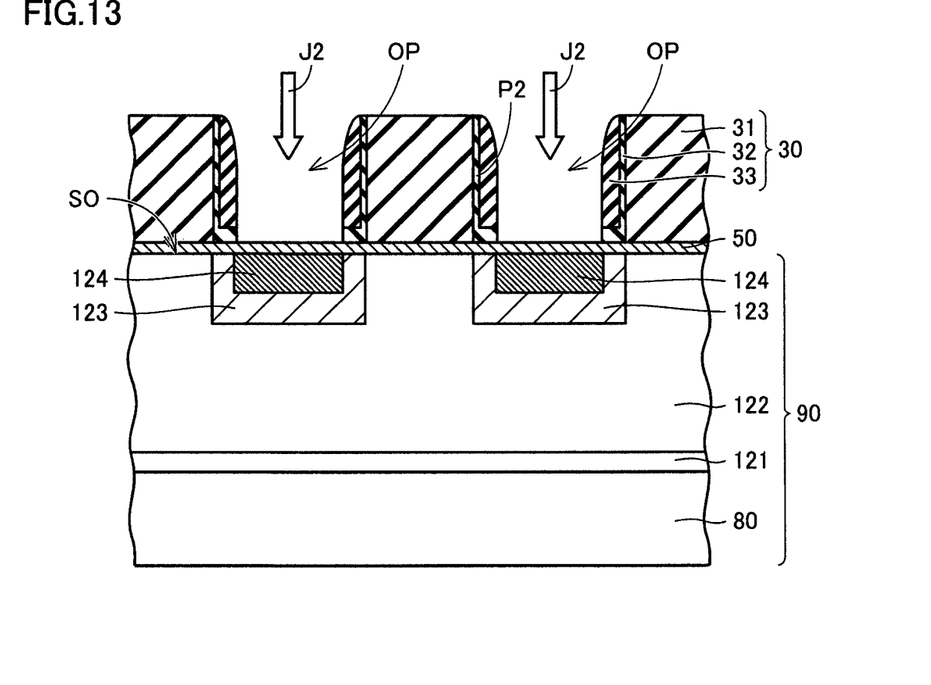
FIG. 13 is a partial cross-sectional view schematically showing a twelfth step in the method of manufacturing a silicon carbide semiconductor device in FIG. 1.

As shown in FIG. 13, as a result of ion implantation J2 through opening OP narrowed by portion P2 of end point film 32 and spacer film 33 arranged on portion P2, an n-type (the second conductivity type) impurity is implanted onto epitaxial substrate 90. Thus, $n^+$ region 124 is formed from surface S0 to a prescribed depth in epitaxial substrate 90.

Figure 14:
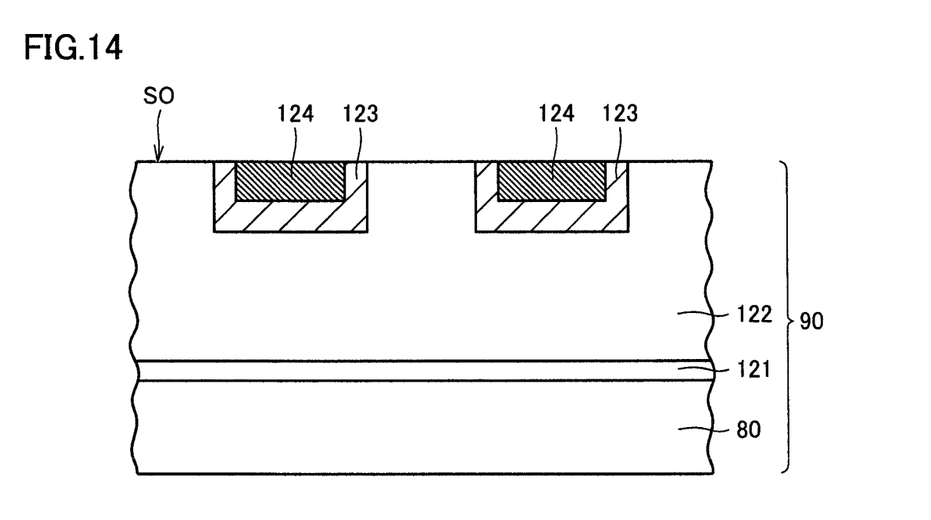
FIG. 14 is a partial cross-sectional view schematically showing a thirteenth step in the method of manufacturing a silicon carbide semiconductor device in FIG. 1.

As further shown in FIG. 14, composite mask 30 and etching stop layer 50 are removed. In addition, activation heat treatment is performed. This heat treatment is performed, for example, by performing heating at 1700° C. in an argon atmosphere for 30 minutes.

Figure 15:
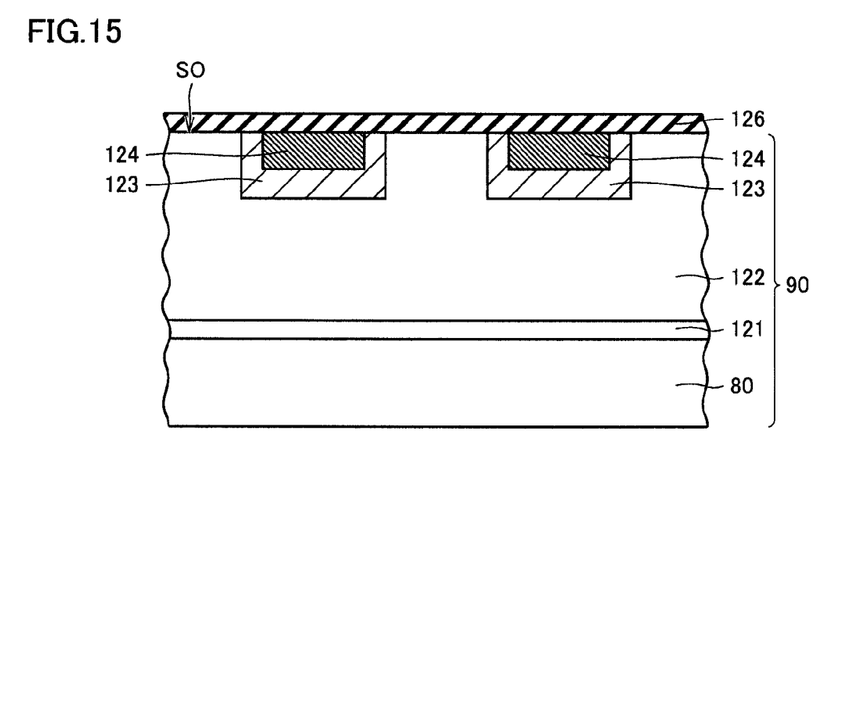
FIG. 15 is a partial cross-sectional view schematically showing a fourteenth step in the method of manufacturing a silicon carbide semiconductor device in FIG. 1.

As shown in FIG. 15, oxide film 126 to serve as a gate insulating film is formed on epitaxial substrate 90. Specifically, oxide film 126 is formed to cover breakdown voltage holding layer 122, p region 123, and $n^+$ region 124. Formation may be carried out by dry oxidation (thermal oxidation). Conditions in dry oxidation are, for example, a heating temperature of 1200° C. and a heating time period of 30 minutes.

Thereafter, a nitriding heat treatment step is performed. This heat treatment is performed, for example, by performing heating in a nitrogen monoxide (NO) atmosphere at 1100° C. for 120 minutes. Consequently, nitrogen atoms are introduced in the vicinity of an interface between each of breakdown voltage holding layer 122, p region 123 and $n^+$ region 124 and oxide film 126. It is noted that, after this heat treatment step using nitrogen monoxide, heat treatment using an argon (Ar) gas which is an inert gas may further be performed. Conditions in this heat treatment are, for example, a heating temperature of 1100° C. and a heating time period of 60 minutes.

Figure 16:
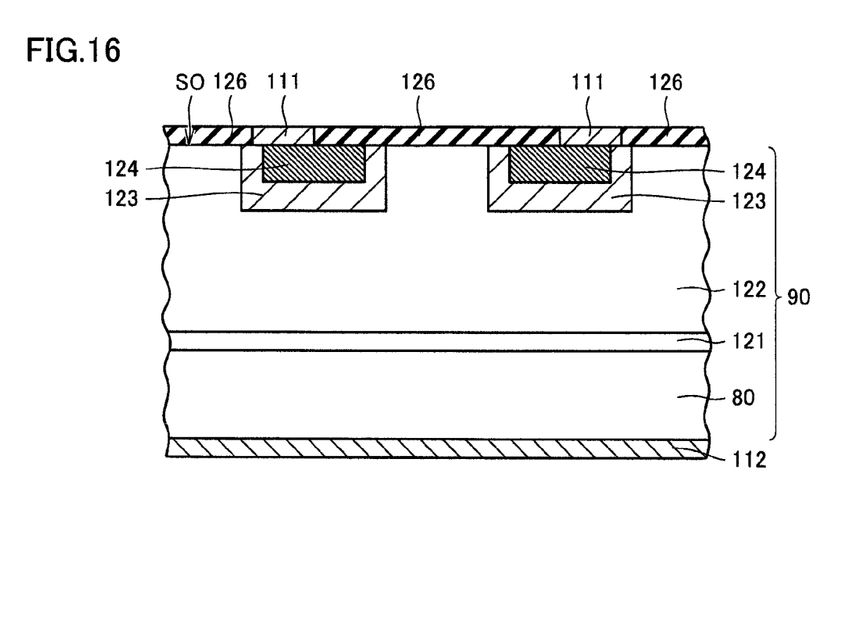
FIG. 16 is a partial cross-sectional view schematically showing a fifteenth step in the method of manufacturing a silicon carbide semiconductor device in FIG. 1.

As shown in FIG. 16, source electrode 111 is formed. Specifically, the following step is performed.

A resist film having a pattern is formed on oxide film 126 with photolithography. Using this resist film as a mask, a portion of oxide film 126 located on $n^+$ region 124 is etched away. Thus, an opening is formed in oxide film 126. Then, a conductor film is formed in this opening to be in contact with $n^+$ region 124. Then, by removing the resist film, a portion of the conductor film above that has been located on the resist film is removed (lift-off). This conductor film may be a metal film and it is composed, for example, of nickel (Ni). As a result of this lift-off, source electrode 111 is formed.

It is noted that heat treatment for alloying is preferably performed here. For example, heat treatment for 2 minutes at a heating temperature of 950° C. in an atmosphere of an argon (Ar) gas which is an inert gas is performed.

Referring again to FIG. 1, upper source electrode 127 is formed on source electrode 111. In addition, gate electrode 110 is formed on oxide film 126. Moreover, drain electrode 112 is formed on a back surface (a lower surface in the drawing) of single crystal substrate 80. MOSFET 100 is obtained as described above.

Figure 17:
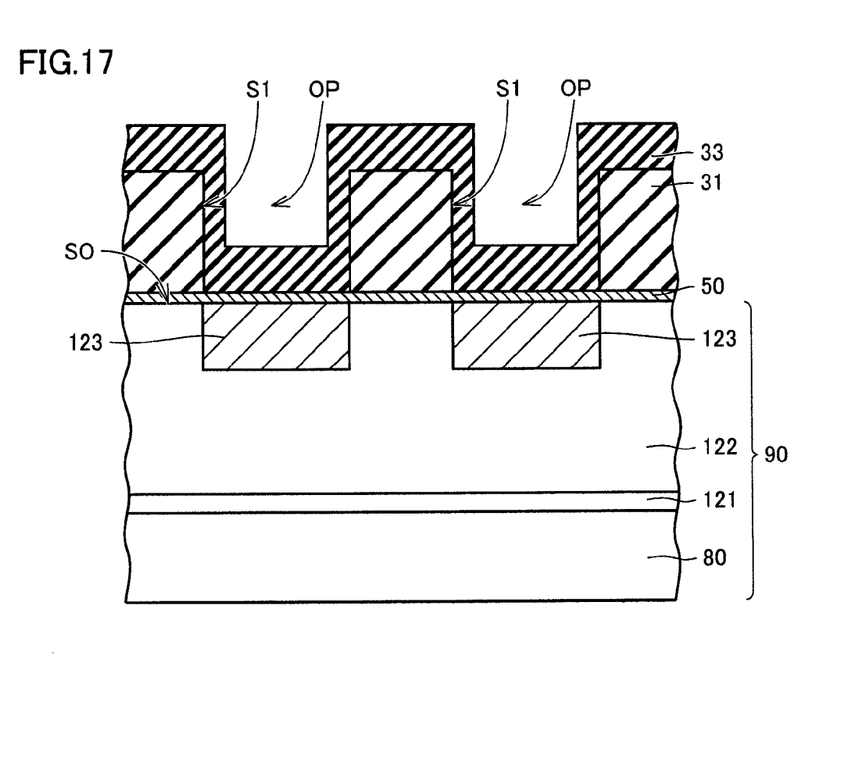
FIG. 17 is a cross-sectional view schematically showing a first step in a manufacturing method in a comparative example.
Figure 18:
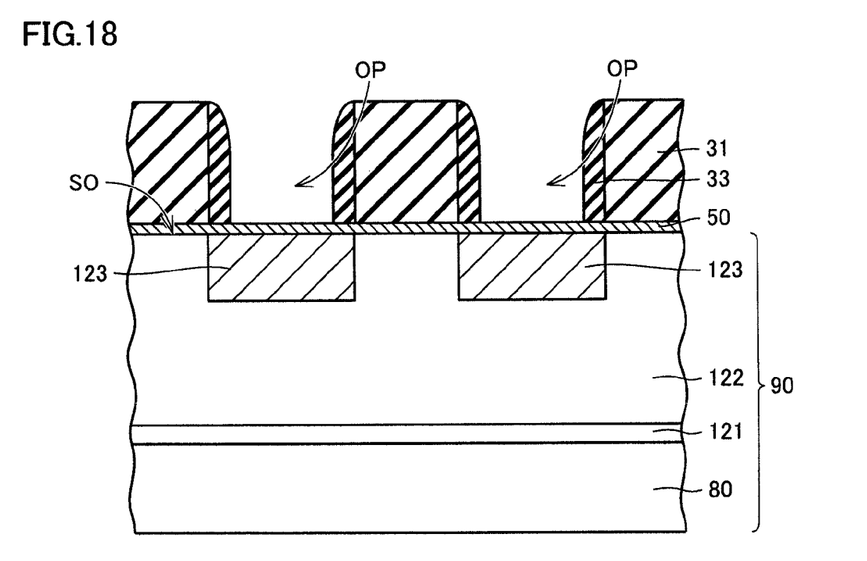
FIG. 18 is a cross-sectional view schematically showing a second step in the manufacturing method in the comparative example.
Figure 19:
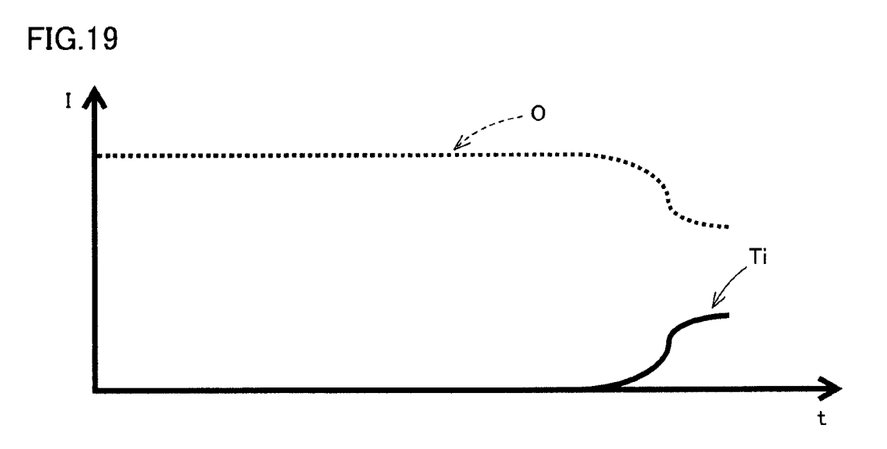
FIG. 19 is a graph showing one example of how an end point is detected in the comparative example.

A comparative example will now be described. In the comparative example, unlike the present embodiment (FIG. 10), spacer film 33 is formed without end point film 32 being provided (FIG. 17). It is assumed that mask layer 31 and the spacer film are made of silicon oxide and etching stop layer 50 is made of titanium. Thereafter, anisotropic etching as in the present embodiment is performed. As etching of spacer film 33 proceeds, an upper surface of mask layer 31 and etching stop layer 50 in opening OP are exposed (FIG. 18). Here, since both of the material for spacer film 33 and the material for mask layer 31 are silicon oxide, exposure of the upper surface of mask layer 31 cannot be an object to be detected as an end point. Therefore, an object to be detected as an end point is only exposure of etching stop layer 50 in opening OP. Variation in intensity I in end point detection (FIG. 19), that is, lowering in O (oxygen) atom intensity or increase in Ti (titanium) atom intensity, can theoretically be detected. Such variation in intensity, however, originates from difference in material exposed through opening OP. Therefore, as a ratio of an area of opening OP occupied in mask layer 31 is lower, variation in intensity is less. As thus variation in intensity is less, end point detection is actually difficult.

Figure 20:
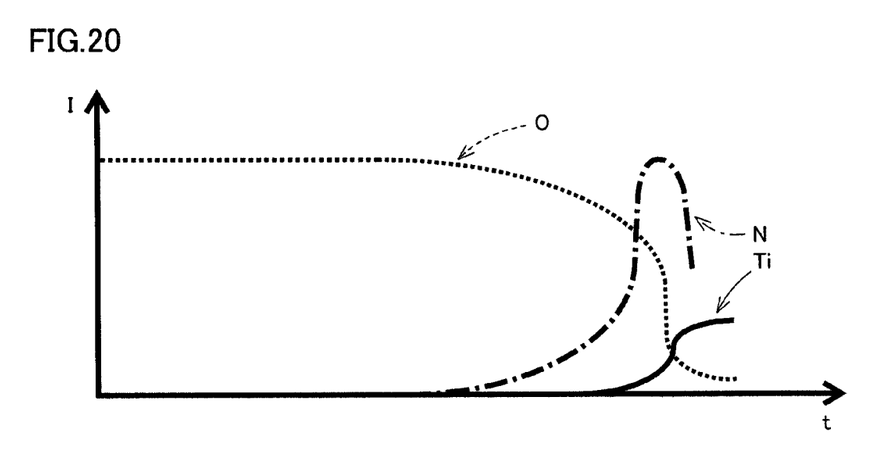
FIG. 20 is a graph showing one example of how an end point is detected in the first embodiment of the present invention.

In contrast, with end point film 32 (FIG. 10) being provided as in the present embodiment, for example in a case where end point film 32 is made of silicon nitride, exposure of portion P1 of end point film 32 at the upper surface of mask layer 31 leads to abrupt increase in nitrogen (N) atom intensity (FIG. 20). Therefore, since end point detection is easy, etching can accurately be stopped.

More generally discussing this aspect, according to the present embodiment, an end point of anisotropic etching of spacer film 33 is detected based on sensing of etching of end point film 32 (FIG. 11) being performed. Since etching of end point film 32 is performed not only in opening OP (FIG. 9) in mask layer 31 but also on cover portion CV (FIG. 9) of mask layer 31, it can accurately be sensed that etching of end point film 32 is performed. As anisotropic etching of spacer film 33 can thus accurately be stopped, spacer film 33 can accurately remain on sidewall S1 of opening OP. Therefore, since ion implantation J2 (FIG. 13) of the n-type impurity is carried out through accurately narrowed opening OP, an n-type region can accurately be formed in a part of the region into which a p-type impurity has been implanted (p region 123) through opening OP.

In addition, as etching stop layer 50 is formed (FIG. 3), overetching of epitaxial substrate 90 can be suppressed (FIGS. 11 and 12).

Preferably, the material for mask layer 31 is the same as the material for spacer film 33, and in this case, the method of manufacturing MOSFET 100 can further be simplified.

The material for etching stop layer 50 may be the same as the material for end point film 32, and in this case, the method of manufacturing MOSFET 100 can further be simplified. Alternatively, they may be different from each other, and in this case, a selective etching ratio between etching stop layer 50 and end point film 32 can be ensured. Therefore, accuracy in an amount of remaining etching stop layer 50 (FIG. 12) after anisotropic etching (FIG. 11) can be enhanced. Therefore, variation in implantation of an n-type impurity through etching stop layer 50 can be suppressed.

Preferably, a material for end point film 32 does not contain a metal element, so that metal contamination of an apparatus for manufacturing MOSFET 100 can be avoided.

Second Embodiment

In the present embodiment as well, initially, steps substantially similar to those in FIGS. 2 to 9 (the first embodiment) are performed.

Figure 21:
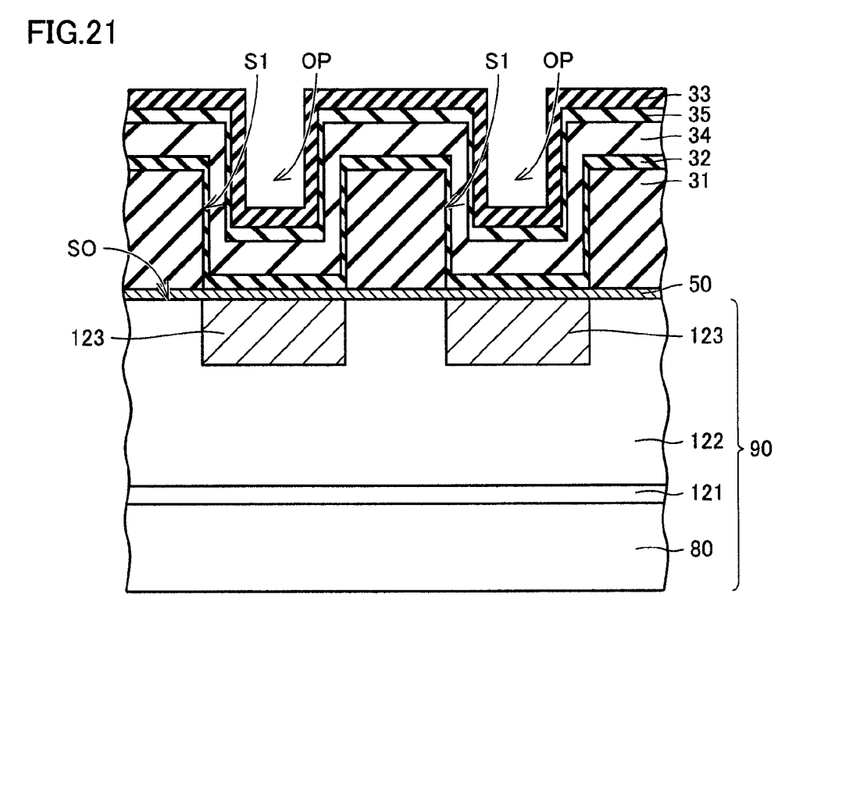
FIG. 21 is a partial cross-sectional view schematically showing one step in a method of manufacturing a silicon carbide semiconductor device in a second embodiment of the present invention.

As shown in FIG. 21, then, an intermediate film 34 (a third film) made of a material different from the material for end point film 32 is formed. An intermediate film 35 (a fourth film) made of a material the same as the material for end point film 32 is formed on intermediate film 34. Spacer film 33 is formed on intermediate film 35. Preferably, a material for intermediate film 34 is the same as at least any of a material for mask layer 31 and a material for spacer film 33.

Then, MOSFET 100 (FIG. 1) is obtained through steps substantially similar to those in FIGS. 11 to 18 (the first embodiment).

Since a construction other than the above is substantially the same as the construction in the first embodiment described above, the same or corresponding elements have the same reference characters allotted and description thereof will not be repeated.

Figure 22:
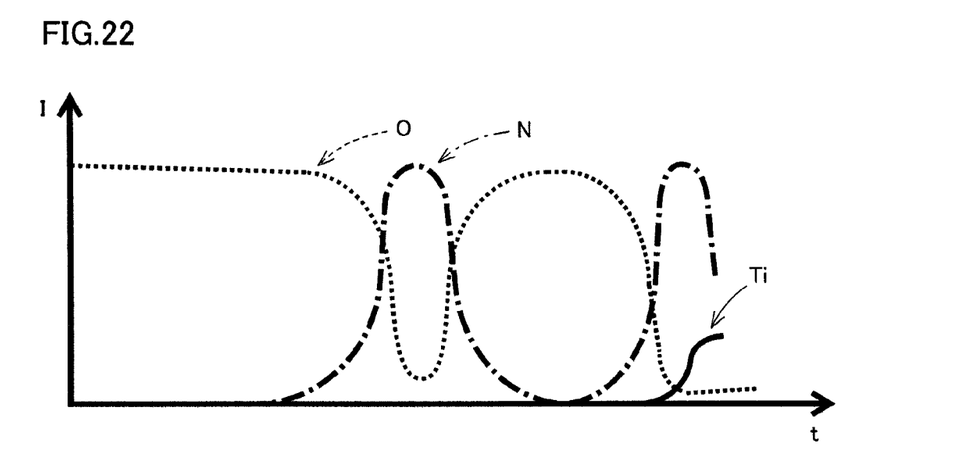
FIG. 22 is a graph showing one example of how an end point is detected in the second embodiment of the present invention.

According to the present embodiment, as etching proceeds, etching of a material for intermediate film 35 is sensed, and thereafter, at a time interval, etching of the same material involved with etching of end point film 32 will be sensed. Namely, prior to sensing of etching of end point film 32, etching of intermediate film 35, which predicts the same, is sensed. Therefore, accuracy in stopping etching can further be enhanced. For example, in a case where a material for each of mask layer 31, intermediate film 34, and spacer film 33 is silicon oxide, a material for each of end point film 32 and intermediate film 35 is silicon nitride, and a material for etching stop layer 50 is titanium, variation in intensity I as shown in FIG. 22 is sensed. Specifically, prior to final increase in N (nitrogen) atom intensity, peak of N atom intensity is detected.

Though etching stop layer 50 is exposed at the time of ion implantation J2 (FIG. 13) in each embodiment above, this is not essential and end point film 32 may remain on etching stop layer 50. In addition, ion implantation J2 does not necessary have to be performed through etching stop layer 50 and etching stop layer 50 does not have to be formed.

In addition, though the p-type is defined as the first conductivity type and the n-type is defined as the second conductivity type, the n-type may be defined as the first conductivity type and the p-type may be defined as the second conductivity type. Preferably, a conductivity type is selected such that a semiconductor device has an n-type channel.

Further, though a MOSFET has been described in detail, a semiconductor device may be a MISFET (Metal Insulator Semiconductor Field Effect Transistor) other than the MOSFET. Furthermore, a semiconductor device may be other than a MISFET and it may be, for example, an IGBT (Insulated Gate Bipolar Transistor).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a silicon carbide semiconductor device, comprising the steps of:
    forming a mask layer having an opening on a silicon carbide substrate;
    implanting an impurity of a first conductivity type onto said silicon carbide substrate through said opening in said mask layer;
    forming a first film made of a first material, which does not substantially contain a metal element, on said silicon carbide substrate to cover said mask layer;
    forming a second film made of a second material different from said first material, on said silicon carbide substrate to cover said mask layer and said first film;
    performing anisotropic etching for removing a portion of said second film;
    sensing an exposed part of said first film during said anisotropic etching;
    stopping said anisotropic etching after sensing said first film;
    implanting an impurity of a second conductivity type onto said silicon carbide substrate using said second film as a mask after said step of stopping said anisotropic etching; and
    removing said mask layer, said first film, and said second film.

2. The method of manufacturing a silicon carbide semiconductor device according to claim 1, wherein
    said mask layer is made of said second material.

3. The method of manufacturing a silicon carbide semiconductor device according to claim 1, further comprising, after said step of forming a first film and before said step of forming a second film, the steps of:
    forming a third film made of a material different from said first material; and
    forming a fourth film made of said first material on said third film.

4. The method of manufacturing a silicon carbide semiconductor device according to claim 1, further comprising the step of forming an underlying layer on said silicon carbide substrate before said step of forming a mask layer.

5. The method of manufacturing a silicon carbide semiconductor device according to claim 4, wherein
    said underlying layer is made of said first material.

6. The method of manufacturing a silicon carbide semiconductor device according to claim 4, wherein
    said underlying layer is made of a material different from said first material.

7. The method of manufacturing a silicon carbide semiconductor device according to claim 1, wherein
    said first material does not contain a metal element.

8. The method of manufacturing a silicon carbide semiconductor device according to claim 7, wherein
    said first material is made of any of a silicon-based material and a carbon-based material.

* * * * *